(12) United States Patent
Jun et al.

(10) Patent No.: US 12,500,207 B2
(45) Date of Patent: Dec. 16, 2025

(54) PACKAGING ARCHITECTURE WITH INTERMEDIATE ROUTING LAYERS

(71) Applicant: Intel Corporation, Santa Clara, CA (US)

(72) Inventors: Kimin Jun, Portland, OR (US); Adel A. Elsherbini, Tempe, AZ (US); Christopher M. Pelto, Beaverton, OR (US); Georgios Dogiamis, Chandler, AZ (US); Bradley A. Jackson, Lake Oswego, OR (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 862 days.

(21) Appl. No.: 17/543,419

(22) Filed: Dec. 6, 2021

(65) Prior Publication Data
US 2023/0178513 A1 Jun. 8, 2023

(51) Int. Cl.
| | |
|---|---|
| *H01L 25/065* | (2023.01) |
| *H01L 23/00* | (2006.01) |
| *H01L 23/538* | (2006.01) |
| *H01L 25/00* | (2006.01) |

(52) U.S. Cl.
CPC ...... *H01L 25/0652* (2013.01); *H01L 23/5383* (2013.01); *H01L 23/5384* (2013.01); *H01L 24/16* (2013.01); *H01L 24/80* (2013.01); *H01L 24/96* (2013.01); *H01L 25/50* (2013.01); *H01L 2224/16145* (2013.01); *H01L 2224/16227* (2013.01); *H01L 2224/80895* (2013.01); *H01L 2224/80896* (2013.01); *H01L 2225/06572* (2013.01)

(58) Field of Classification Search
CPC ....... H01L 25/0652; H01L 2225/06524; H01L 2225/06548; H01L 23/5389
See application file for complete search history.

(56) References Cited

U.S. PATENT DOCUMENTS

| | | | | |
|---|---|---|---|---|
| 2019/0385977 A1* | 12/2019 | Elsherbini | ........... | H01L 23/5389 |
| 2020/0411445 A1* | 12/2020 | Chen | .................. | H01L 23/5386 |
| 2021/0057346 A1* | 2/2021 | Tsai | .................... | H01L 23/5381 |
| 2021/0257335 A1* | 8/2021 | Shih | ........................ | H01L 25/50 |
| 2022/0254756 A1* | 8/2022 | Choi | ................... | H01L 25/0652 |
| 2022/0344287 A1* | 10/2022 | Yu | ......................... | H01L 23/645 |

\* cited by examiner

*Primary Examiner* — Ratisha Mehta
*Assistant Examiner* — Adam Joseph Mott
(74) *Attorney, Agent, or Firm* — Akona IP PC

(57) ABSTRACT

Embodiments of the present disclosure provide a microelectronic assembly comprising: a first plurality of integrated circuit (IC) dies in a first layer; a second plurality of IC dies in a second layer; and a third layer between the first layer and the second layer, the third layer comprising conductive routing traces in a dielectric. A first interface is between the first layer and the third layer and includes first interconnects having a first pitch of less than 10 micrometers between adjacent ones of the first interconnects, a second interface is between the second layer and the third layer and includes second interconnects having a second pitch of less than 10 micrometers between adjacent ones of the second interconnects, and the routing traces in the third layer are to provide lateral electrical coupling between the first interconnects and the second interconnects.

16 Claims, 6 Drawing Sheets

PACKAGING ARCHITECTURE WITH INTERMEDIATE ROUTING LAYERS

TECHNICAL FIELD

The present disclosure relates to techniques, methods, and apparatus directed to packaging architecture with intermediate routing layers in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1A:
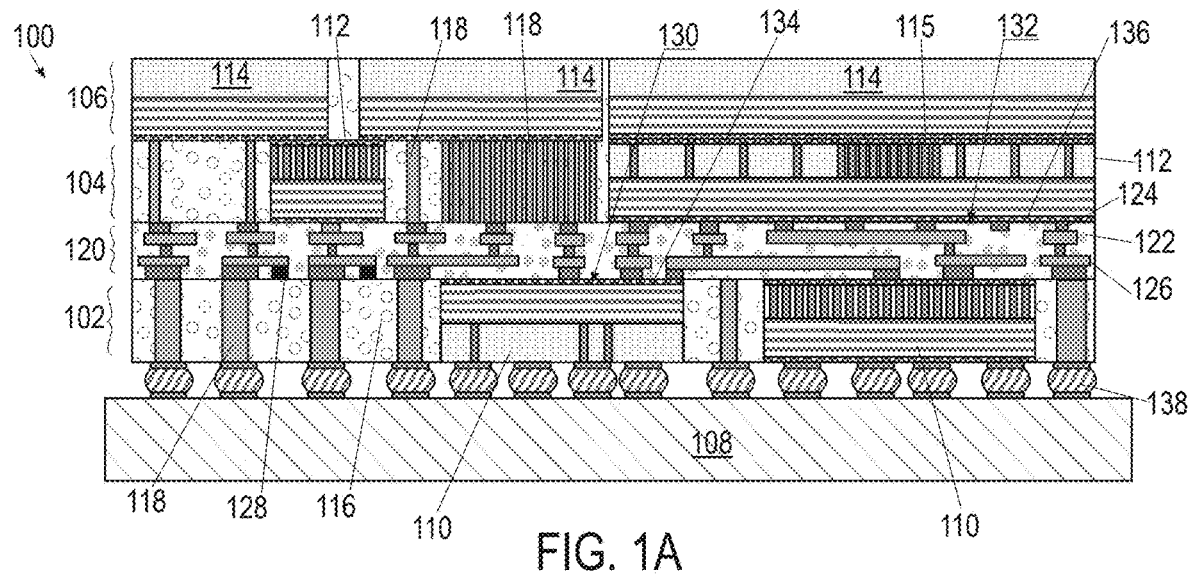
FIG. 1A is a simplified cross-sectional view of an example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller IC dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected together to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different dies, each one optimized in terms of design and manufacturing, the overall yield and cost of the combined die solution may be improved.

The connectivity between these dies is achievable by many different ways. For example, in 2.5D packaging solutions, a silicon interposer and through-substrate vias (TSVs), also called through-silicon vias where the substrate is silicon, connect dies at silicon-interconnect speed in a minimal footprint. In another example, called Embedded Multi-Die Interconnect Bridge (EMIB), a silicon bridge embedded under the edges of two interconnecting dies facilitates electrical coupling between them. In a three-dimensional (3D) architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omnidirectional interconnect (ODI), in which EMIB chips are embedded in an organic mold compound, which allows for top-packaged chips to communicate with other chips horizontally using EMIB and vertically, using through-mold vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine pitch connections which may lead to additional manufacturing and processing overheads without the benefits of the fine pitch. Thus, typical modular server architectures for complex and customized server configurations continue to use large monolithic dies to avoid disaggregation overheads.

In this regard, a quasi-monolithic hierarchical integration architecture using recursively coupled plurality of dies to form microelectronic assemblies helps to mitigate several drawbacks mentioned above. The plurality of dies may comprise active dies and/or passive dies, and at least a portion in the plurality of dies are coupled using die-to-die (DTD) interconnects with sub-10 micrometer pitch, also referred to as "hybrid bonds," "hybrid interconnects," or "direct bond interconnects." In other words, the center-to-center separation between adjacent high-density interconnects is less than or equal to 10 micrometer. In such quasi-monolithic structures, IC dies are stacked in multiple layers with inorganic dielectric between the layers and around the IC dies. Electrical coupling through the dielectric is implemented with through-dielectric vias (TDVs) that are pass-through structures, i.e., they provide an electrical pathway between layers without any intermediate circuitry.

However, this multi-chip assembly inevitably results in complex inter-die routing challenges. While inter-die vertical connections could be accommodated by low loss vertical vias such as through-substrate vias (TSVs), TDVs, or direct hybrid bonds, lateral routing still relies on existing on-die interconnects, resulting in routing congestion, since part of routing resources within an IC die in an intermediate layer must be spared for global routing. Also, depending on the layout, the signal and electrical paths may become very long and pass through highly lossy tight pitch metal layers. Compensating for this signal loss and delay may require additional circuits overhead such as repeaters. Although co-locating laterally coupled circuit blocks and vertically stacking them adjacent to each other may mitigate such routing congestion problems, this solution may be practical only in those cases where the number of IC dies is few. As more and more IC dies are assembled into multi-layer stacks with several IC dies in any single layer, co-locating circuit blocks in disparate components becomes challenging to say the least. Additionally, die placement flexibility diminishes significantly, resulting in design complexity, hot spot, and wafer processability issues.

Embodiments of the present disclosure provide a microelectronic assembly comprising: a first plurality of IC dies in a first layer; a second plurality of IC dies in a second layer; and a third layer between the first layer and the second layer comprising conductive routing traces in a dielectric. a first interface between the first layer and the third layer is coupled with first interconnects distributed with silicon-level interconnect density, a second interface between the second layer and the third layer is coupled with second interconnects distributed with silicon-level interconnect density, and the routing traces in the third layer is to provide at least lateral electrical coupling between the first interconnects and the second interconnects.

As used herein, the term "silicon-level" interconnect density comprises interconnect density greater than 10,000 connections per square millimeter. The term refers to trace pitch and/or via density that is generally found within an IC die (e.g., in metallization layers of the IC die above the active region) as opposed to interconnect density between IC dies of older packaging technologies (e.g., solder-based C4 or larger interconnects). Interconnects arranged with silicon-level interconnect density may have pitch ranging between 0.5 micrometer and 10 micrometers (i.e., in one embodiment, the interconnects may have a pitch of 0.5 micrometer; in another embodiment, the interconnects may have a pitch of 2 micrometer; etc.). In that regard, some DTD interconnects, such as hybrid bonds, are distributed with silicon-level interconnect density.

Embodiments of the present disclosure also provide an IC package comprising: a first IC die having a first interconnect in a first layer; a second IC die having a second interconnect in a second layer; a routing layer comprising dielectric and a conductive routing trace in the dielectric between the first IC die and the second IC die; and a package substrate. The routing trace electrically couples the first interconnect and the second interconnect, and the dielectric comprises an inorganic dielectric.

Embodiments of the present disclosure also provide a method comprising: attaching a first IC die on a carrier; forming a first layer comprising dielectric with TDVs surrounding the first IC die; forming a routing layer over the first layer, the routing layer comprising an inorganic dielectric; and attaching a second IC die over the routing layer with hybrid bonds.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type or P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PIC. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substrate, the term "interconnect" may also refer to, respectively, DTD interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one or more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photo-imageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a simplified cross-sectional view of a microelectronic assembly 100 according to some embodiments of the present disclosure. Microelectronic assembly 100 comprises a plurality of layers, for example, layer 102, layer 104 and layer 106. Only three layers are shown in the figure for ease of explanation, but it may be understood that any number of such layers may be provisioned in microelectronic assembly 100 within the broad scope of the embodiments. Layer 102 may be coupled to a package substrate 108.

In some embodiments, package substrate 108 may comprise a PCB having multiple layers of conductive traces embedded in one or more layers of organic dielectric. For example, package substrate 108 may comprise a laminate substrate with several layers of metal planes or traces that are interconnected to each other by through-hole plated vias, with input/output routing planes on the top and bottom layers, while the inner layers are used as a ground and power plane. In other embodiments, package substrate 108 may comprise an organic interposer; in yet other embodiments, package substrate may comprise an inorganic interposer (e.g., made of glass, ceramic or semiconductor materials). In yet other embodiments, package substrate 108 may comprise a composite of organic and inorganic materials, for example, with an embedded semiconductor die in an organic substrate.

Each layer 102, 104 and 106 comprises one or more IC dies therein. For example, IC dies 110, 112 and 114 are in layers 102, 104 and 106 respectively. In many embodiments, adjacent layers may be mechanically and electrically coupled by DTD interconnects 115. In some embodiments, DTD interconnects 115 may be distributed across the entirety of the bonding interface between the adjacent layers; in other embodiments, DTD interconnects 115 may be limited to coupled IC dies. Each layer 102, 104 and 106 may comprise a dielectric 116 surrounding (or embedding) IC dies 110, 112 and 114 respectively. In some embodiments, dielectric 116 may comprise different materials in different layers; in other embodiments, the same material may pervade all layers in microelectronic assembly 100. In various embodiments, dielectric 116 may comprise inorganic materials, such as silicon oxide, silicon nitride, silicon oxynitride, silicon oxycarbide, silicon carbide, silicon carbonitride, etc.

TDVs 118 may extend through dielectric 116 in one or more layers. For example, some TDVs 118 may be present only in layer 102 (e.g., coupling IC dies 114 and 110 through layer 104, or coupling IC die 112 with package substrate 108 through layer 102); some other TDVs 118 may be present in both layers 102 and 104 (e.g., directly coupling IC die 114 with package substrate 108 through layers 102 and 104). In some embodiments, all TDVs 118 may be of the same size; in other embodiments, TDVs 118 may be of different sizes, for example, some may carry power and may be larger than others that carry signals and are smaller. In some embodiments, some TDVs 118 may be spaced farther apart from each other than other TDVs 118, whereas in other embodiments, TDVs 118 may all be uniformly spaced apart, depending on their functionalities, assembly footprint, and other design and manufacturing considerations.

In some embodiments, a routing layer 120 may be provisioned between two adjacent layers, for example, layers 102 and 104. Note that although routing layer 120 is shown only between layers 102 and 104, routing layer 120 may also, or alternatively, be provisioned between any two of other layers, including layers 104 and 106 (and any other layers as appropriate). Routing layer 120 comprises a dielectric 122, conductive vias 124 and conductive routing traces 126 therein. In some embodiments, dielectric 122 may comprise the same material as dielectric 116; in other embodiments, dielectric 122 may comprise a different material. Although conductive vias 124 and conductive routing traces 126 are shown in different shading, they may comprise the same material, and the shading is merely for ease of explanation. Conductive routing traces 126 may comprise bond pads, power planes, signal traces and in some cases, passive components such as transformers, inductors, resistors, and capacitors.

In some embodiments, routing layer 120 may also comprise active back-end-of-line (BEOL) devices 128 that are compatible with (e.g., are located in) BEOL materials and processing. Examples of BEOL devices 128 comprise thin-film transistors (e.g., indium tin oxide transistors), thin-film diodes, microelectromechanical systems (MEMS) (e.g., accelerometers, gyroscopes, resonators, etc.) and opto-electro-mechanical systems (e.g., optical MEMS).

Interfaces between routing layer 120 and adjacent layers, for example, layers 102 and 104 may be electrically and mechanically coupled with DTD interconnects. For example, an interface 130 between layers 102 and 120 and another interface 132 between layers 104 and 120 may be coupled with DTD interconnects 134 and 136 respectively. In many embodiments, DTD interconnects 134 and 136 may comprise interconnects having silicon-level interconnect density. In some embodiments, DTD interconnects 134 may have a different pitch than DTD interconnects 136; in other embodiments, DTD interconnects 134 may have the same pitch as DTD interconnects 136. In some embodiments, the DTD interconnects (e.g., 134, 136) may be provisioned along the entire corresponding interface (e.g., 130, 132); in other embodiments, the DTD interconnects (e.g., 134, 136) may be provisioned only along connected components, such as IC dies 110 and 112, for example. DTPS interconnects 138 may couple layer 102 with package substrate 108.

Figure 1B:
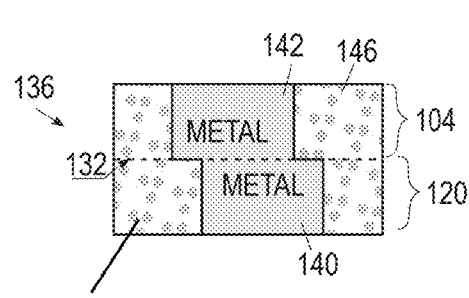
FIG. 1B is a simplified cross-sectional view of a hybrid bond in the example microelectronic assembly of FIG. 1A, according to some embodiments of the present disclosure.

FIG. 1B shows an individual one of an example embodiment of DTD interconnects 136 comprising hybrid bonds in greater detail. Note that although one of DTD interconnects 136 is shown, the same structure and description may apply to any other DTD interconnects (e.g., 115) comprising hybrid bonds in microelectronic assembly 100. At interface 132 between layer 104 and routing layer 120, conductive contact 142 of layer 104 (e.g., belonging to IC die 112) may bond with conductive contact 140 of routing layer 120; likewise, dielectric 146 (e.g., silicon oxide, silicon nitride, silicon oxynitride, etc.) in layer 104 (e.g., belonging to IC die 112) may bond with dielectric 122 of layer 120. The bonded interconnects form DTD interconnects 136, comprising hybrid bonds, providing electrical and mechanical coupling between layer 104 and routing layer 120. DTD interconnects 136 may have a pitch of less than 10 micrometers between adjacent interconnects.

Figure 1C:
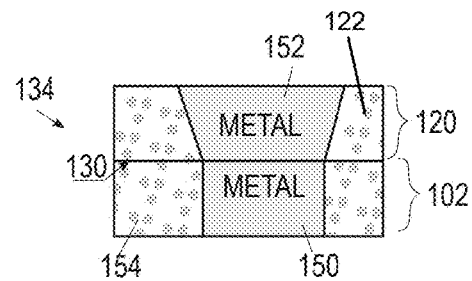
FIG. 1C is a simplified cross-sectional view of an interconnect in the example microelectronic assembly of FIG. 1A, according to some embodiments of the present disclosure.

FIG. 1C shows an individual one of an example embodiment of DTD interconnects 134 comprising a non-hybrid bond having a pitch less than 10 micrometers. At interface 130 between layer 102 and routing layer 120, conductive contact 150 of layer 102 (e.g., belonging to IC die 110) may be conductively in contact with conductive via 152 of routing layer 120. In various embodiments, such conductive contact may be achieved by suitable processes known in the art, for example, depositing dielectric 122 over layer 102, etching to form a trench via and then filling the trench via with conductive metal to form conductive via 152; another example is a semi-additive process, in which conductive via 152 is formed and then dielectric 122 is deposited around it. In all such embodiments, dielectric 154 (e.g., silicon oxide, silicon nitride, silicon oxynitride, etc.) in layer 102 (e.g., belonging to IC die 110) may be in contact with dielectric 122 of layer 120. In various embodiments, such contact may result in adhesion, thereby forming a mechanical bond between dielectric 154 and dielectric 122. The conductive contacts at interface 132 form DTD interconnects 134, providing electrical coupling between layer 102 and routing layer 120. In many embodiments, structural differences between DTD interconnects 134 and DTD interconnects 136 may be visible in the shapes of the conductive contacts forming the bonds, the various layers therebetween that are artefacts of the processes involved in forming them, etc. DTD interconnects 134 may have a pitch of less than 10 micrometers between adjacent interconnects.

Turning back to FIG. 1A, conductive routing traces 126 may be patterned to provide lateral electrical coupling between two of DTD interconnects 134; conductive routing traces may also be patterned to provide vertical electrical coupling between one of DTD interconnects 134 and another of DTD interconnects 136. In many embodiments, conductive routing traces 126 may be configured independent of IC dies 110 and/or 112. For example, conductive routing traces 126 need not be limited by a process node or functionality of IC die 110.

In some embodiments, TDV 118 in layer 102 may be electrically coupled to another TDV in layer 104 by conductive vias 124 and conductive routing traces 126 of routing layer 120. In some embodiments, TDV 118 in layer 102 may be electrically coupled to IC die 112 in layer 104 by conductive vias 124 and conductive routing traces 126 of routing layer 120. In some embodiments, IC die 110 in layer 102 may be electrically coupled to TDV 118 in layer 104 by conductive vias 124 and conductive routing traces 126 of routing layer 120. In some embodiments, IC die 110 in layer 102 may be electrically coupled to IC die 112 in layer 104 by conductive vias 124 and conductive routing traces 126 of routing layer 120. In some embodiments, one TDV 118 in layer 102 may be coupled to another TDV 118 in layer 102 by conductive vias 124 and conductive routing traces 126 of routing layer 120. In some embodiments, TDV 118 in layer 102 may be coupled to IC die 110 in layer 102 by conductive vias 124 and conductive routing traces 126 of routing layer 120. Likewise, one TDV 118 in layer 104 may be coupled to another TDV 118 in layer 104 by conductive vias 124 and conductive routing traces 126 of routing layer 120. In some embodiments, TDV 118 in layer 104 may be coupled to IC die 112 in layer 104 by conductive vias 124 and conductive routing traces 126 of routing layer 120. Conductive routing traces 126 may also be patterned to electrically coupled BEOL devices 128 suitably with TDVs 118 and/or IC dies (e.g., 110, 112) in layer 102 and/or 104 as appropriate.

In many embodiments, conductive routing traces 126 comprise metal lines having silicon-level line spacing. As used herein, the term "silicon-level line spacing" refers to the line spacing in typical BEOL metallization stack in a semiconductor IC die. Silicon-level line spacing may comprise 10 micrometers or smaller. For example, in one embodiment, conductive routing traces 126 comprise metal lines having 1 micrometer line spacing; in another embodiment, conductive routing traces 126 may comprise metal lines having 10 micrometer line spacing; in yet another embodiment, the smallest line spacing may be 1 micrometer, while other metal lines may be spaced wider apart.

In some embodiments, conductive routing traces 126 may be wide and/or thick metal lines, having low resistance and/or low parasitic capacitance. In some embodiments, routing layer 120 may comprise a single layer of conductive routing traces 126, flanked by conductive vias 124 on one or both sides as appropriate; in other embodiments, routing layer 120 may comprise several layers of metal lines and dielectric with vias coupling metal lines in adjacent layers. Note that line width and line spacing of conductive routing traces 126 can be independent of routing within IC dies (e.g., 110, 112, 114).

In some embodiments, routing layer 120 may function similar to a redistribution layer. For example, one of the upper layer IC dies, say IC die 114 in layer 106, is replaced with another IC die in a different location, or having a different bond pad pattern. In the absence of routing layer 120, this change can be accommodated only by changing the configuration of IC dies in underlying layers 104 and 102 and changing package substrate 108 to another with a different bond pad layout. With routing layer 120, however, the change in the top layer can be accommodated by conductive routing traces 126 in routing layer 120 to accommodate the different location of the new IC die relative to the first IC die without changing package substrate 108.

Note that in the example embodiment shown in FIG. 1A, some IC dies are shown in a face-to-face (FTF) configuration, whereas some other IC dies are shown in a face-to-back (FTB) configuration. Although not shown, some IC dies may be coupled in a back-to-back (BTB) configuration without departing from the scope of the embodiments described herein.

Further, note that in FIGS. 1A and 1n subsequent figures, the DTD interconnects (e.g., 115, 134, 136) are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering. Note that FIGS. 1A, 1B are intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIG. 1A may include more dies along with other electrical components. Additionally, although some components of the assemblies are illustrated in FIGS. 1A-1C as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

Figure 2:
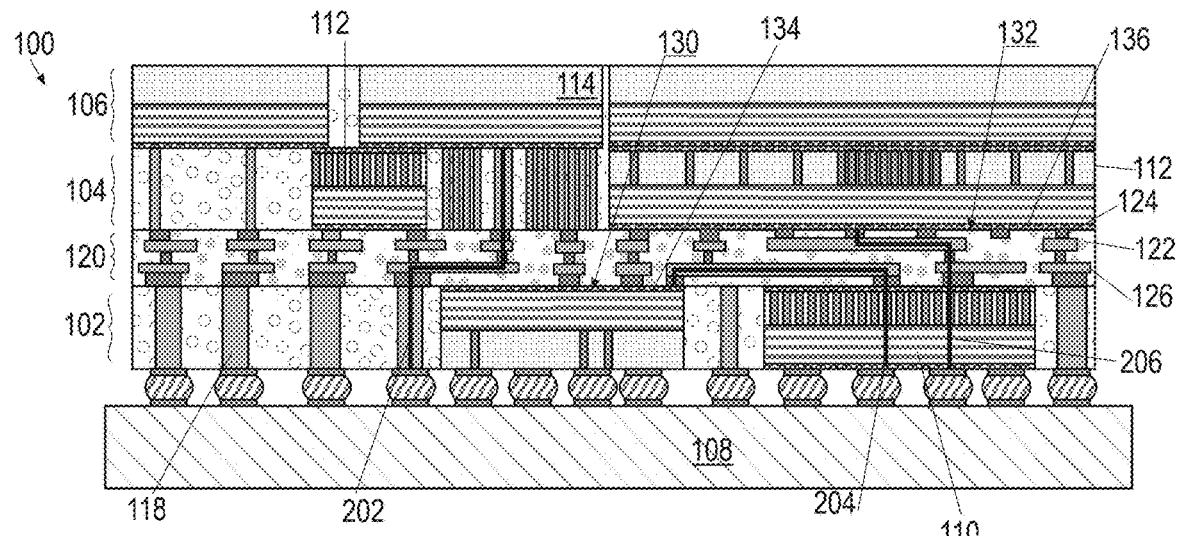
FIG. 2 is a simplified cross-sectional view illustrating example operations of a microelectronic assembly according to some embodiments of the present disclosure.

FIG. 2 is a simplified cross-sectional view of an example microelectronic assembly 100 according to some embodiments of the present disclosure to explain three different routing possibilities with routing layer 120. An example routing 202, e.g., for power distribution, may provide electrical coupling between package substrate 108 and IC die 114 in layer 106, through TDV 118 in layer 102. If routing layer 120 were absent, routing 202 may be forced to go through IC die 112 in layer 104 (e.g., because of the placement of IC die 112 over the particular TDV 118), leading to performance degradations because of the high electrical resistance in the metallization layers of IC die 112. By routing laterally through conductive routing traces 126 and conductive vias 124 in routing layer 120, such performance degradation can be overcome.

Another example routing 204, e.g., for signal routing between two IC dies 110 in layer 102 may be routed laterally through conductive routing traces 126 and conductive vias 124 having low-resistivity and low parasitic capacitance in routing layer 120. In the absence of routing layer 120, such routing may have to be implemented through IC die 112 in layer 104, leading to routing congestion because of lack of resources in IC die 112 for global (e.g., extra-die) routing. Besides, when a particular IC die 112 has to be designed taking into account routing for other IC dies 110, the design cycle itself may get congested and back-logged, for example, because all three IC dies need to be designed, routed, and placed together. Routing layer 120 can alleviate this problem by allowing IC dies 110 and 112 to be designed independent of any inter-die (e.g., global) routing in microelectronic assembly 100.

Another example routing 206 electrically coupling a specific DTD interconnect 134 on IC die 110 with another specific DTD interconnect 136 on IC die 112 in layer 104 may be routed vertically and laterally through conductive routing traces 126 and conductive vias 124 in routing layer 120. In the absence of routing layer 120, the specific DTD interconnect 134 on IC die 110 and the specific DTD interconnect 136 on IC die 112 have to be placed touching each other so that they can be electrically coupled. Alternatively, any misalignment needs to be accounted by re-routing in the high-resistivity metallization of IC die 110 or IC die 112, leading to performance degradation. With routing layer 120, such problems are mitigated, because the relative misalignment of the specific DTD interconnects can be accommodated by suitable redistribution in routing layer 120 with low-resistivity and low-parasitics conductive routing traces 126.

Although only three specific examples of routing using routing layer 120 are described herein, any other routing scenarios can be accommodated suitably with appropriate patterning of conductive routing traces 126 and conductive vias 124. Further, by using multiple layers of metal lines and dielectric in routing layer 120, virtually any complex routing between layers 102 and 104 can be accommodated suitably.

In various embodiments, any of the features discussed with reference to any of FIGS. 1-2 herein may be combined with any other features to form a package with one or more IC dies as described herein, for example, to form a modified microelectronic assembly 100. Some such combinations are described above, but, in various embodiments, further combinations and modifications are possible.

Example Methods

FIGS. 3A-3I are simplified cross-sectional views of various stages of manufacture of microelectronic assembly 100.

Figure 3A:
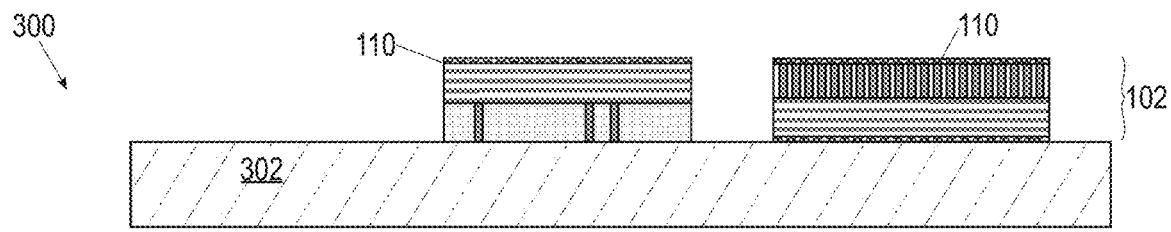
FIGS. 3A-3I are simplified cross-sectional views of various stages of manufacture of an example microelectronic assembly, according to some embodiments of the present disclosure.

FIG. 3A illustrates an assembly 300 comprising a carrier 302 on which IC dies 110 of layer 102 may be attached, for example, using a removable adhesive. Carrier 302 may comprise a wafer in some embodiments (e.g., wafer of approximately 300 mm diameter). In other embodiments, carrier 302 may comprise a panel (e.g., panel approximately 500 mm×500 mm). The choice of panel or wafer may be dependent on various considerations that are beyond the scope of the embodiments herein, such as thermal budget, coefficient of thermal expansion, process equipment, etc.

Figure 3B:
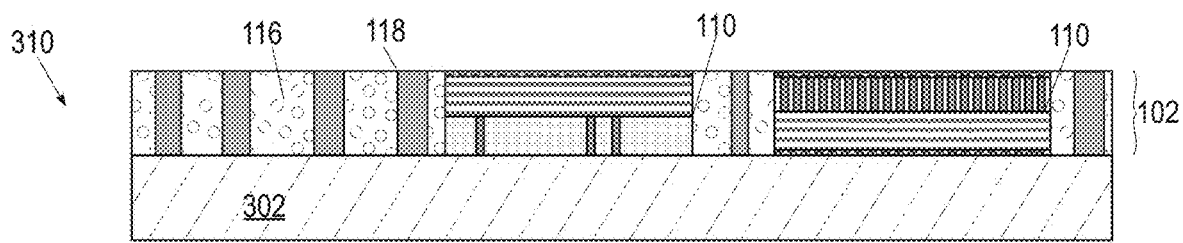

FIG. 3B illustrates an assembly 310 subsequent to depositing dielectric 116 around IC dies 110 and forming TDVs 118 therein. In some embodiments where dielectric 116 comprises silicon nitride, silicon oxynitride, silicon carbide, silicon carbonitride, silicon oxide, silicon oxycarbide, or similar inorganic materials, dielectric 116 may be deposited by physical vapor deposition processes, chemical vapor deposition processes, or other suitable processes known in the art. Note that a removable adhesive layer between dielectric 116 and carrier 302 may enable carrier 302 to be debonded at a later state from dielectric 116 as appropriate.

Figure 3C:
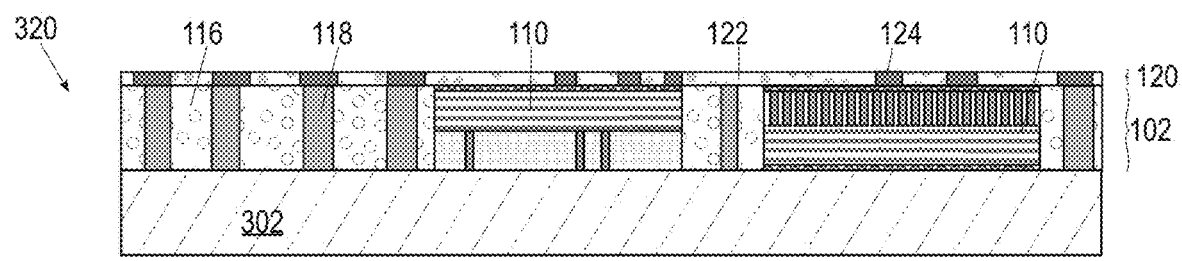

FIG. 3C illustrates an assembly 320 subsequent to forming conductive vias 124 in dielectric 122 of routing layer 120 over layer 102. In many embodiments where dielectric 122 comprises silicon nitride, silicon oxynitride, silicon carbide, silicon carbonitride, silicon oxide, silicon oxycarbide, or similar inorganic materials, dielectric 122 may be deposited by physical vapor deposition processes, chemical vapor deposition processes, or other suitable processes known in the art. Conductive vias 124 may be formed in dielectric 122 by one of many processes, for example, a semi-additive process or a damascene process.

In some embodiments where a semi-additive process is used, conductive vias 124 are formed first, followed by deposition of dielectric 122. For example, a seed layer is plated over layer 102, followed by deposition of a photoresist over the seed layer. In many embodiments, the choice of the seed layer may depend on the material of conductive vias 124, which may comprise one or more of copper, aluminum, silver, and gold. For example, conductive vias 124 may comprise copper, and the seed layer may also comprise copper. The photoresist may be patterned such that areas corresponding to vias 124 are exposed. Thereafter, the metal of conductive vias 124 may be electroplated into the pattern. Then, the photoresist is stripped away, and the seed layer is etched away, leaving conductive vias 124 in the form of conductive pillars on layer 102. In some other embodiments, a seed layer is plated over layer 102, followed by electroplating metal over the seed layer. Thereafter, a photoresist may be deposited over the electroplated metal. The photoresist may be patterned such that areas corresponding to conductive vias 124 are hidden under the photoresist. Then, the exposed metal may be etched away, followed by stripping of the photoresist, leaving conductive vias 124 in the form of conductive pillars on layer 102. Thereafter, dielectric 122 may be deposited around conductive vias 124, for example, by physical vapor deposition.

In some other embodiments, a damascene process may be used, in which dielectric 122 is deposited first, followed by forming conductive vias 124. In such embodiments, dielectric 122 may be patterned suitably to form trenches corresponding to conductive vias 124. Then conductive metal may be electroplated over the trenches to form conductive vias 124, and any excess metal and/or barrier layer suitably etched away as appropriate.

Figure 3D:
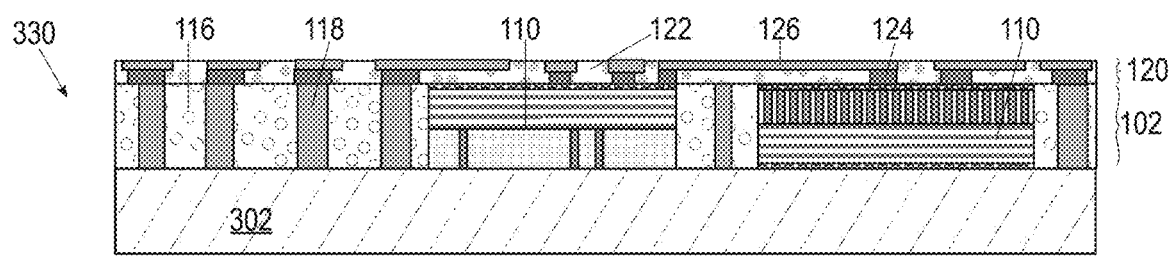

FIG. 3D illustrates an assembly 330 subsequent to forming conductive routing traces 126 over conductive vias 124. In many embodiments, a seed layer is plated over dielectric 122 and conductive vias 124, followed by electroplating metal over the seed layer. Thereafter, a photoresist may be deposited over the electroplated metal. The photoresist may be patterned such that areas corresponding to conductive routing traces 126 are hidden under the photoresist. Then, the exposed metal may be etched away, followed by stripping of the photoresist, leaving conductive routing traces 126 on dielectric 122. In other embodiments, a seed layer is plated over dielectric 122, followed by deposition of photoresist over the seed layer. The photoresist may be patterned such that areas corresponding to conductive routing traces 126 are exposed. Thereafter, conductive metal may be electroplated into the pattern. Then, the photoresist is stripped away, and the seed layer is etched away, leaving conductive routing traces 126 over dielectric 122. In yet other embodiments, dielectric 122 may be etched according to the pattern of conductive routing traces 126 to form trenches. Thereafter, conductive metal is electroplated into the trenches and excess metal etched away, leaving conductive routing traces 126 over dielectric 122.

Figure 3E:
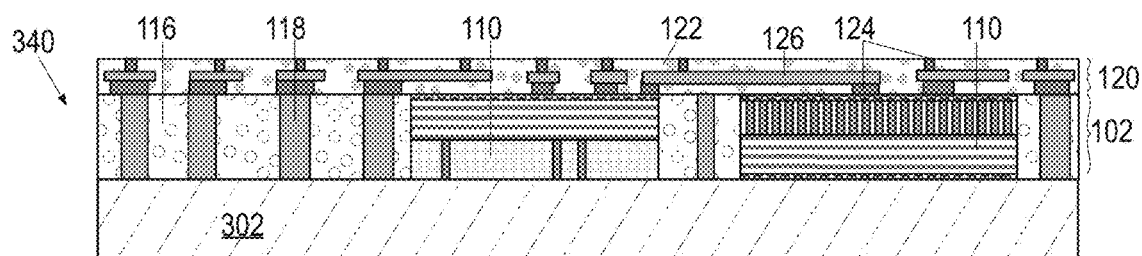

FIG. 3E illustrates an assembly 340 subsequent to forming another layer comprising conductive vias 124 in dielectric 122 over conductive routing traces 126. The operations may be similar to those described in reference to FIG. 3C.

Figure 3F:
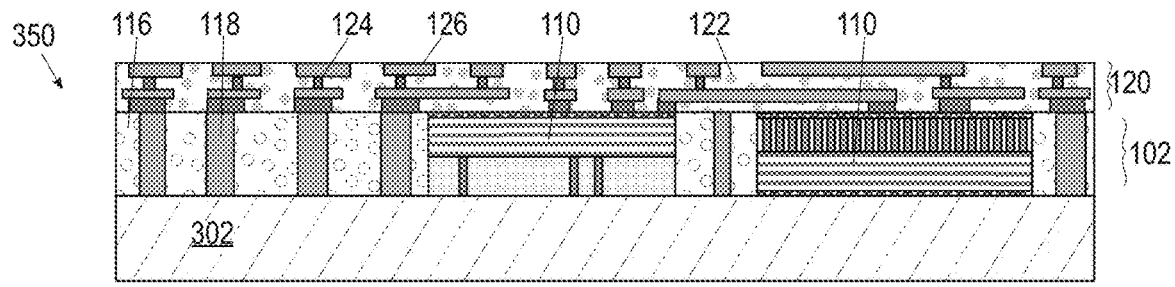

FIG. 3F illustrates an assembly 350 subsequent to forming another layer of conductive routing traces 126 over dielectric 122. The operations may be similar to those described in reference to FIG. 3D. The steps described in FIGS. 3C-3D may be repeated as many times as necessary to create a multi-layered routing layer 120, although only two layers of conductive routing traces 126 are shown in the figure; any number of layers may be built in routing layer 120 without departing from the broad scope of the embodiments.

Figure 3G:
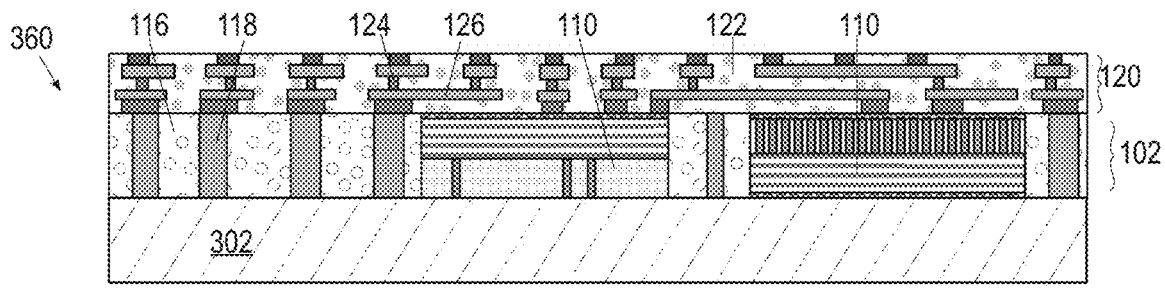

FIG. 3G illustrates an assembly 360 subsequent to forming hybrid bond pads over the last (e.g., topmost) conductive routing traces 126 in routing layer 120.

Figure 3H:
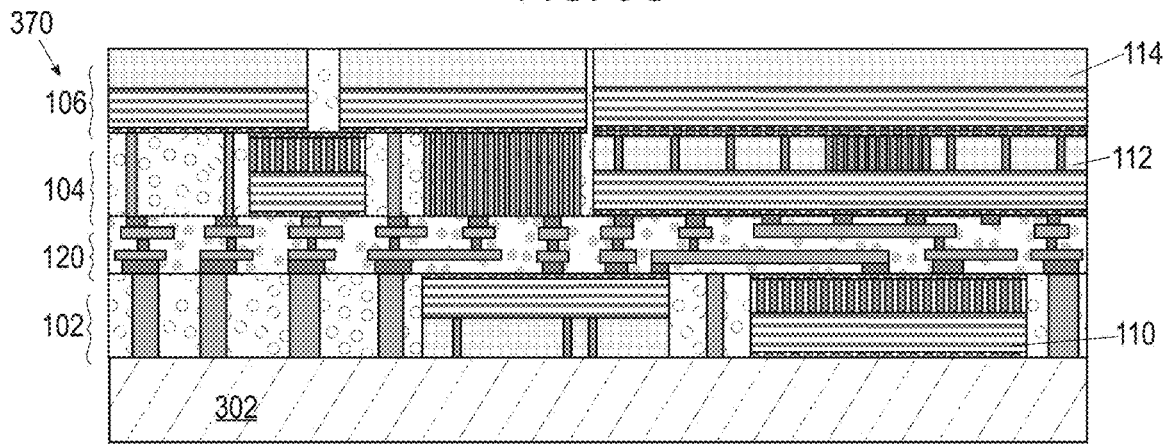

FIG. 3H illustrates an assembly 370 subsequent to adding layers 104 and 106. In some embodiments, another routing layer 120 may be formed as described above between layers 104 and 106. The operations may be repeated as many times as needed to create a multi-layered microelectronic assembly.

Figure 3I:
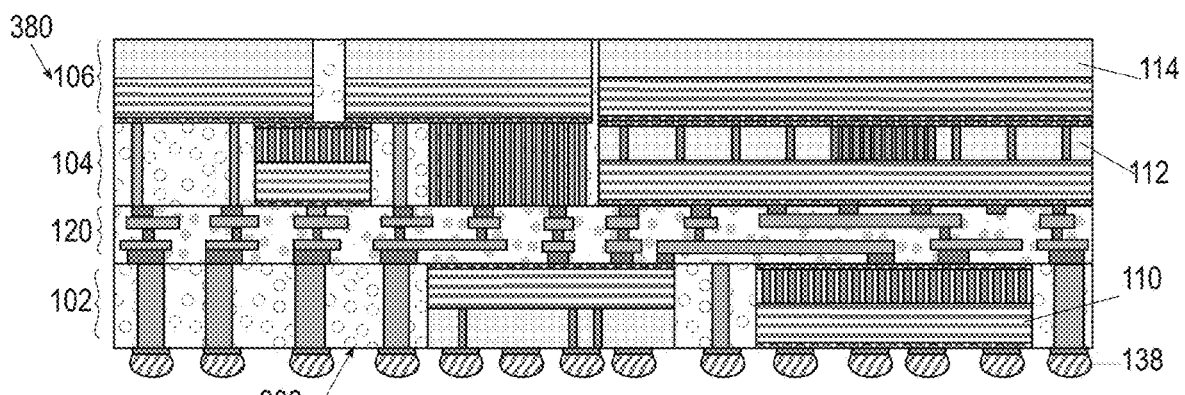

FIG. 3I illustrates an assembly 380 subsequent to debonding carrier 302 to expose surface 382. Bond pads of DTPS interconnects 138 may be formed on surface 382, for example, by electroplating and lithography processes. In some embodiments, solder bumps may also be formed thereon, through a solder paste application and reflow process. Assembly 380 may be in panel or wafer form and as such, may comprise multiple ones of microelectronic assembly 100. Subsequent to forming bond pads and/or solder bumps, assembly 380 may be diced into individual ones of microelectronic assembly 100 and coupled to package substrate 108 with DTPS interconnects 138 as appropriate.

Although the operations as shown herein start the fabrication process with layer 102 closest to package substrate 108, the operations as described may be modified to start the fabrication process with the layer farthest from package substrate 108, for example, layer 106, and then proceeding to build other layers (e.g., 120, 104 and 102) sequentially without departing from the scope of the embodiments of the present disclosure.

Although the operations illustrated in FIGS. 3A-3I are described once each and in a particular order, the operations may be performed in any suitable order and repeated as desired. For example, one or more operations may be performed in parallel to manufacture multiple IC packages substantially simultaneously. In another example, the operations may be performed in a different order to reflect the structure of a particular IC package in which one or more microelectronic assembly 100 as described herein may be included. Numerous variations are also possible to achieve the desired structure of microelectronic assembly 100.

Furthermore, the operations illustrated in FIGS. 3A-3I may be combined or may include more details than described. Still further, the operations may further include other manufacturing operations related to fabrication of other components of the semiconductor assemblies described herein, or any devices that may include semiconductor assemblies as described herein. For example, additional operations may include various cleaning operations, surface planarization operations (e.g., using CMP), operations for surface roughening, operations to include barrier and/or adhesion layers as desired, and/or operations for incorporating packages as described herein in, or with, an IC die, a computing device, or any desired structure or device.

Example Devices and Components

Figure 4:
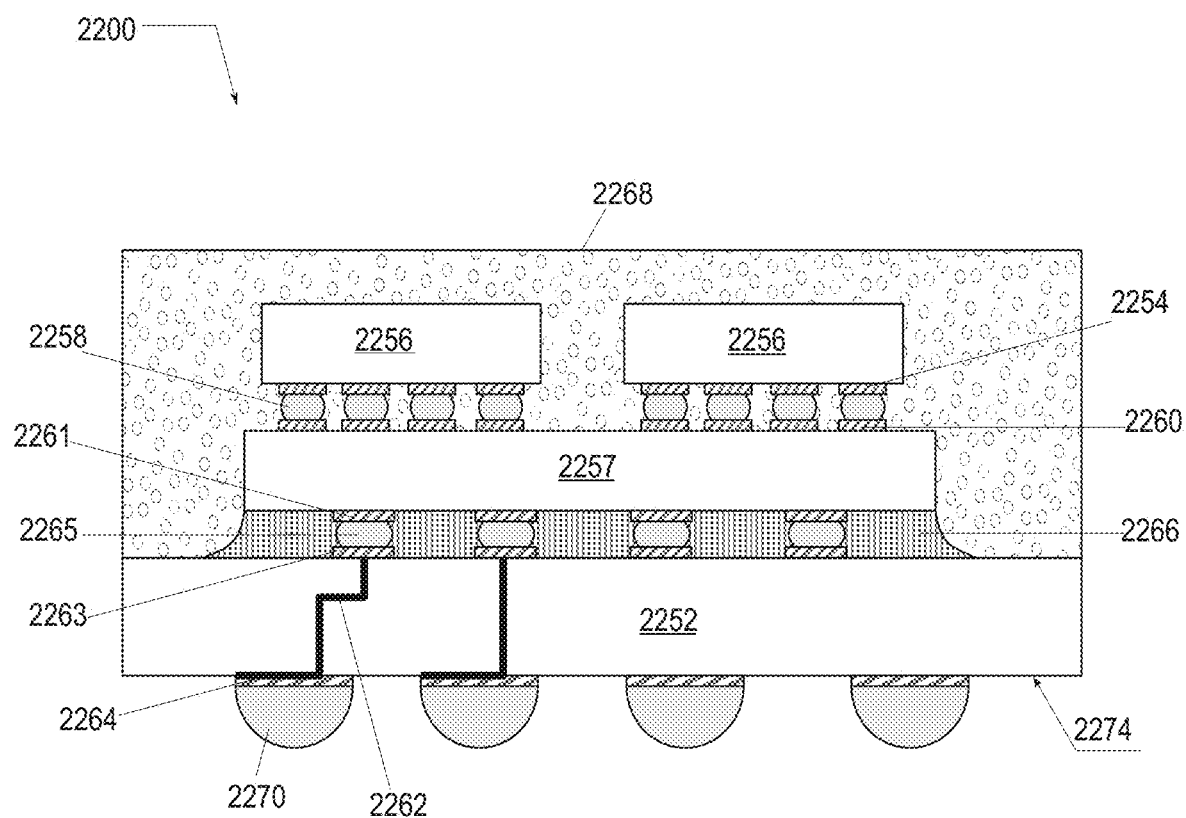
FIG. 4 is a cross-sectional view of a device package that includes one or more microelectronic assemblies in accordance with any of the embodiments disclosed herein.
Figure 5:
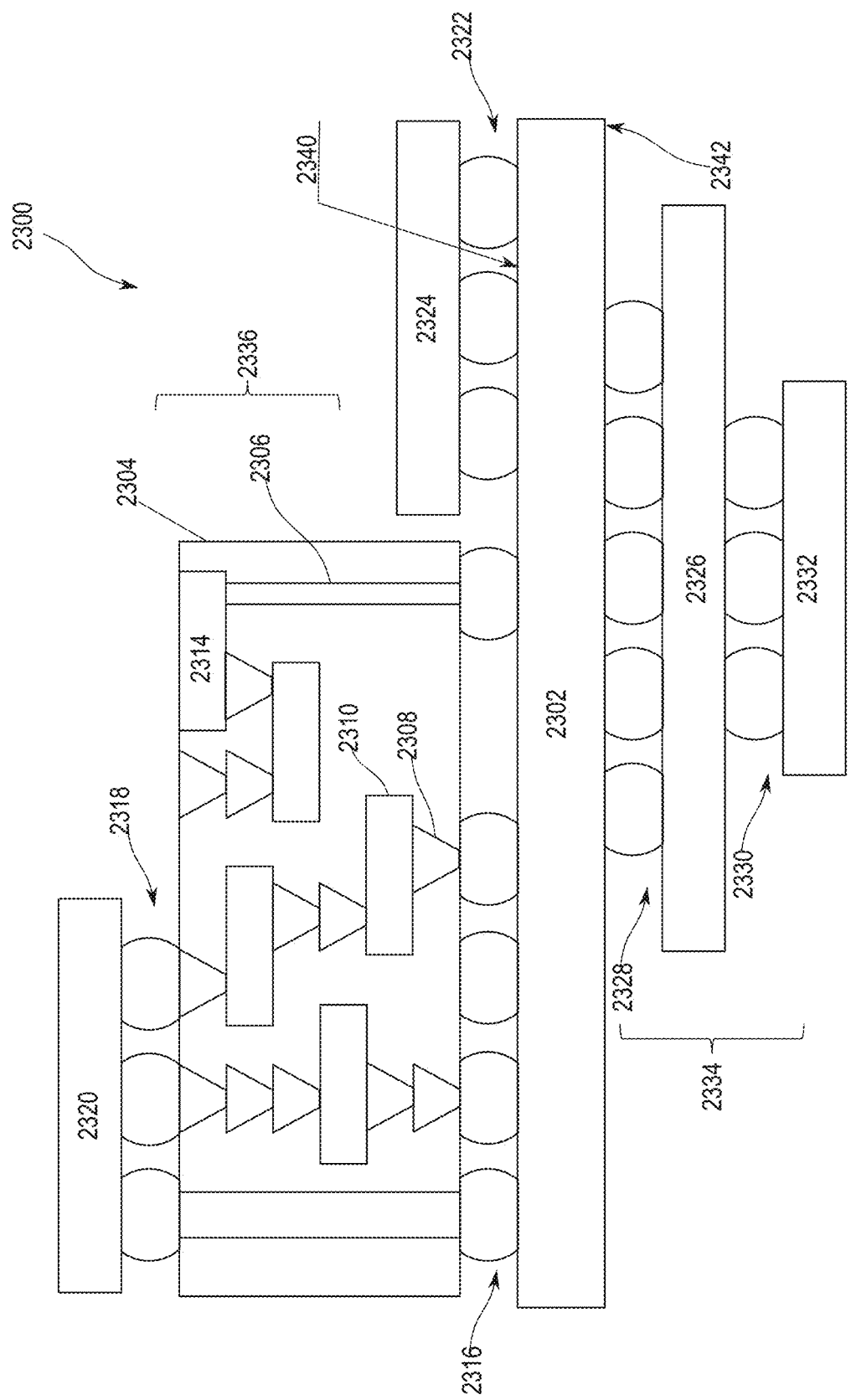
FIG. 5 is a cross-sectional side view of a device assembly that includes one or more microelectronic assemblies in accordance with any of the embodiments disclosed herein.
Figure 6:
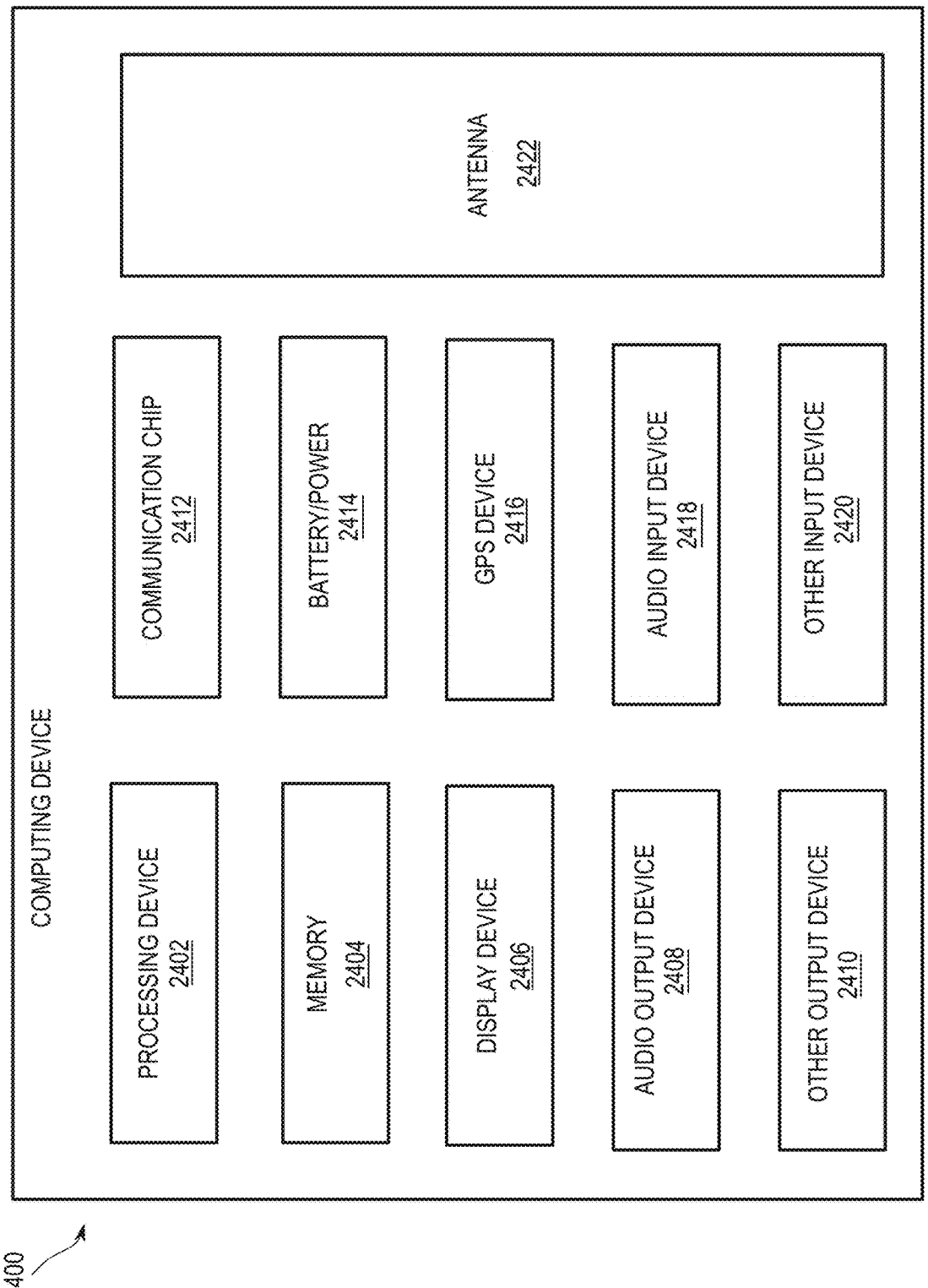
FIG. 6 is a block diagram of an example computing device that includes one or more microelectronic assemblies in accordance with any of the embodiments disclosed herein.

The packages disclosed herein, e.g., any of the embodiments shown in FIGS. 1-2 or any further embodiments described herein, may be included in any suitable electronic component. FIGS. 4-6 illustrate various examples of packages, assemblies, and devices that may be used with or include any of the IC packages as disclosed herein.

FIG. 4 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 5.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 5 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 4.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 4. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and MEMS devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 6 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 4). In yet another example, any one or more of the components of computing device 2400 may include an IC device assembly 2300 (e.g., as shown in FIG. 5).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100), comprising: a first plurality of integrated circuit (IC) dies (e.g., 110) in a first layer (e.g., 102); a second plurality of IC dies (e.g., 112) in a second layer (e.g., 104); and a third layer (e.g., 120) between the first layer and the second layer, the third layer comprising conductive routing traces (e.g., 126) in a dielectric (e.g., 122). A first interface (e.g., 130) is between the first layer and the third layer and includes first interconnects (e.g., 134) having a first pitch of less than 10 micrometers between adjacent ones of the first interconnects, a second interface (e.g., 132) is between the second layer and the third layer and includes second interconnects (e.g., 136) having a second pitch of less than 10 micrometers between adjacent ones of the second interconnects, and the routing traces in the third layer are to provide lateral electrical coupling between the first interconnects and the second interconnects.

Example 2 provides the microelectronic assembly of example 1, in which the dielectric comprises a first dielectric, and the second layer comprises a second dielectric (e.g., 116) with through-dielectric vias (TDVs) (e.g., 118) in the second dielectric.

Example 3 provides the microelectronic assembly of any of examples 1-2, in which the dielectric comprises a compound of silicon and at least one of oxygen, carbon, and nitrogen.

Example 4 provides the microelectronic assembly of any of examples 1-3, in which the routing traces comprise lines that include one or more electrically conductive materials and has a line spacing of less than 10 micrometers between adjacent ones of the lines.

Example 5 provides the microelectronic assembly of any of examples 1-4, in which the routing traces in the routing layer have a lower resistance than conductive traces in the first plurality of IC dies and the second plurality of IC dies.

Example 6 provides the microelectronic assembly of any of examples 1-5, in which the routing traces in the routing layer have a lower parasitic capacitance than conductive traces in the first plurality of IC dies and the second plurality of IC dies.

Example 7 provides the microelectronic assembly of any of examples 1-6, in which: line width and line spacing of the routing traces in the routing layer are different from line width and line spacing of conductive traces within the first plurality of IC dies and the second plurality of IC dies.

Example 8 provides the microelectronic assembly of any of examples 1-7, in which the third layer further comprises passive components.

Example 9 provides the microelectronic assembly of any of examples 1-8, in which the third layer further comprises at least one of a diode and a transistor (e.g., 128).

Example 10 provides the microelectronic assembly of any of examples 1-9, in which the third layer comprises a plurality of dielectric layers and metal layers, with conductive vias (e.g., 124) through the dielectric layer to electrically couple the metal layers.

Example 11 provides an IC package, comprising: a first IC die (e.g., 110) having a first interconnect (e.g., 134) in a first layer (e.g., 102); a second IC die (e.g., 112) having a second interconnect (e.g., 136) in a second layer (e.g., 104); a routing layer (e.g., 120) comprising a dielectric (e.g., 122) and a routing trace (e.g., 126) in the dielectric, the routing trace being between the first IC die and the second IC die to electrically couple the first interconnect and the second interconnect, in which the dielectric comprises an inorganic material; and a package substrate (e.g., 108).

Example 12 provides the IC package of example 11, in which: the dielectric is a first dielectric, the routing trace is a first routing trace, and the IC package further comprises: a second dielectric (e.g., 116) in the first layer; a TDV (e.g., 118) in the second dielectric; and a second routing trace in the routing layer, to electrically couple the TDV and the second IC die.

Example 13 provides the IC package of example 12, in which a distance between the first routing trace and the second routing trace is less than 10 micrometers.

Example 14 provides the IC package of example 11, in which: the dielectric is a first dielectric, the routing trace is a first routing trace, and the IC package further comprises: a second dielectric in the first layer and the second layer; a first TDV in the second dielectric of the first layer; a second TDV in the second dielectric of the second layer; and a second routing trace in the routing layer, to electrically couple the first TDV and the second TDV.

Example 15 provides the IC package of example 11, in which the first interconnect and the second interconnect comprise die-to-die (DTD) interconnects having a pitch of less than 10 micrometers.

Example 16 provides the IC package of any of examples 11-15, in which the package substrate is coupled to one of the first layer and the second layer.

Example 17 provides the IC package of example 16, in which the package substrate is coupled with die-to-package-substrate (DTPS) interconnects (e.g., 138) having another pitch greater than 10 micrometers.

Example 18 provides the IC package of any of examples 11-17, in which the dielectric comprises a compound of silicon and at least one of oxygen, carbon, and nitrogen.

Example 19 provides the IC package of any of examples 11-18, in which: the IC package is a first IC package, the first IC die is located at a first location in the first IC package, the routing trace is a first routing trace between the first interconnect at the first location and the second interconnect at a second location, a second IC package is substantially identical to the first IC package in components and arrangement of the components except in following differences: the first IC die is located at a third location in the first IC package, the routing trace in the second IC package is a second routing trace, and the second routing trace is between the first interconnect at the third location and the second interconnect at the second location.

Example 20 provides the IC package of any of examples 11-20, in which the routing layer further comprises at least one of: a transformer, an inductor, a capacitor, a resistor, a diode and a transistor.

Example 21 provides a method, comprising: attaching a first IC die on a carrier (e.g., FIG. 3A); forming a first layer comprising a first dielectric with TDVs surrounding the first IC die (e.g., FIG. 3B); forming a routing layer over the first layer, in which the routing layer comprises a second dielectric (e.g., FIGS. 3C-3G); and attaching a second IC die over the routing layer with hybrid bonds (e.g., FIG. 3H).

Example 22 provides the method of example 21, in which forming the routing layer comprises: forming a second layer over the first layer, the second layer comprising the second dielectric with conductive vias in the second dielectric (e.g., FIG. 3C); forming conductive traces over the second layer (e.g., FIG. 3D); and repeating forming the second layer and forming the conductive traces until the routing layer is completed (e.g., FIGS. 3E-3F).

Example 23 provides the method of example 22, in which forming the second layer includes using a process in which the second dielectric is deposited before the conductive vias are formed.

Example 24 provides the method of example 23, in which the process comprises: depositing the second dielectric over the first layer; forming trenches in the second dielectric, the trenches corresponding to the conductive vias; at least partially filling the trenches with one or more electrically conductive materials to form the conductive vias; and removing an excess of the one or more electrically conductive materials.

Example 25 provides the method of example 24, in which depositing the second dielectric over the first layer comprises at least one of: physical vapor deposition and chemical vapor deposition of the second dielectric.

Example 26 provides the method of example 22, in which forming the second dielectric with conductive vias comprises using a process in which the second dielectric is deposited after the conductive vias are formed.

Example 27 provides the method of example 26, in which the process comprises: forming conductive pillars over the first layer, the conductive pillars corresponding to the conductive vias; and depositing the second dielectric around the conductive pillars.

Example 28 provides the method of example 27, in which depositing the second dielectric around the conductive pillars comprises at least one of: physical vapor deposition and chemical vapor deposition of the second dielectric.

Example 29 provides the method of any of examples 27-28, in which forming the conductive pillars comprises: depositing a seed layer comprising metal; depositing a photoresist over the seed layer; patterning the photoresist using lithography such that areas corresponding to the conductive vias are exposed; electroplating conductive metal into the pattern; removing the photoresist; and removing the seed layer.

Example 30 provides the method of any of examples 27-28, in which forming the conductive pillars comprises: depositing a seed layer comprising metal; electroplating conductive metal on the seed layer; depositing photoresist over the conductive metal; patterning the photoresist using lithography such that areas corresponding to the conductive vias are covered by the photoresist; and removing the conductive metal not covered by the photoresist.

Example 31 provides the method of any of examples 22-30, in which forming the conductive traces comprises: depositing a seed layer comprising metal over the second dielectric; depositing a photoresist over the seed layer; patterning the photoresist such that areas corresponding to the conductive traces are exposed; electroplating conductive metal into the pattern; removing the photoresist; and removing the seed layer.

Example 32 provides the method of any of examples 22-30, in which forming the conductive traces comprises: depositing a seed layer comprising metal over the second dielectric; electroplating conductive metal on the seed layer; depositing photoresist over the conductive metal; patterning the photoresist such that areas corresponding to the conductive traces are covered by the photoresist; and removing the conductive metal not covered by the photoresist.

Example 33 provides the method of any of examples 21-32, further comprising: repeating forming the first layer and the routing layer until a microelectronic assembly with multiple layers of IC dies and routing layers is formed.

Example 34 provides the method of any of examples 21-33, further comprising: debonding from the carrier.

Example 35 provides the method of example 34, further comprising (e.g., FIG. 3I): plating bond pads corresponding to DTPS interconnects; dicing into individual microelectronic assemblies; and attaching a package substrate to each individual microelectronic assembly by the DTPS interconnects.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
   a first plurality of integrated circuit (IC) dies in a first layer;
   a second plurality of IC dies in a second layer; and
   a third layer between the first layer and the second layer, the third layer comprising conductive routing traces and conductive vias in a dielectric,
   wherein:
      a first interface is between the first layer and the third layer and includes first interconnects between conductive contacts of the first layer and a first portion of the conductive vias of the third layer, the first interconnects having a first pitch of less than 10 micrometers between adjacent ones of the first interconnects,
      a second interface is between the second layer and the third layer and includes second interconnects between conductive contacts of the second layer and a second portion of the conductive vias of the third layer, the second interconnects having a second pitch of less than 10 micrometers between adjacent ones of the second interconnects, and
      the routing traces in the third layer are to provide lateral electrical coupling between the first interconnects and the second interconnects.

2. The microelectronic assembly of claim 1, wherein:
   the dielectric comprises a first dielectric, and
   the second layer comprises a second dielectric with through-dielectric vias (TDVs) in the second dielectric.

3. The microelectronic assembly of claim 1, wherein the dielectric comprises a compound of silicon and at least one of oxygen, carbon, and nitrogen.

4. The microelectronic assembly of claim 1, wherein the third layer further comprises passive components.

5. The microelectronic assembly of claim 1, wherein the third layer further comprises at least one of a diode and a transistor.

6. The microelectronic assembly of claim 1, wherein the third layer comprises a plurality of dielectric layers and metal layers, and a third portion of the conductive vias electrically couple the metal layers.

7. An IC package, comprising:
   a first IC die having a first conductive contact in a first layer;
   a second IC die having a second conductive contact in a second layer;
   a routing layer comprising a dielectric and a routing trace, a first via, and a second via in the dielectric, the routing layer being between the first IC die and the second IC die to electrically couple the first IC die and the second IC die, wherein the first conductive contact is bonded to the first via at a first interconnect and the second conductive contact is bonded to the second via at a second interconnect, and the dielectric comprises an inorganic material; and a package substrate.

8. The IC package of claim 7, wherein:
the dielectric is a first dielectric,
the routing trace is a first routing trace, and
the IC package further comprises:
a second dielectric in the first layer;
a TDV in the second dielectric; and
a second routing trace in the routing layer, to electrically couple the TDV and the second IC die.

9. The IC package of claim 8, wherein a distance between the first routing trace and the second routing trace is less than 10 micrometers.

10. The IC package of claim 7, wherein:
the dielectric is a first dielectric,
the routing trace is a first routing trace, and
the IC package further comprises:
a second dielectric in the first layer and the second layer;
a first TDV in the second dielectric of the first layer;
a second TDV in the second dielectric of the second layer; and
a second routing trace in the routing layer, to electrically couple the first TDV and the second TDV.

11. The IC package of claim 7, wherein the first interconnect and the second interconnect comprise die-to-die (DTD) interconnects having a pitch of less than 10 micrometers.

12. The IC package of claim 7, wherein the package substrate is coupled to one of the first layer and the second layer.

13. The IC package of claim 12, wherein the package substrate is coupled with die-to-package-substrate (DTPS) interconnects having another pitch greater than 10 micrometers.

14. The IC package of claim 7, wherein:
the IC package is a first IC package,
the first IC die is located at a first location in the first IC package,
the routing trace is a first routing trace between the first interconnect at the first location and the second interconnect at a second location, and
a second IC package is substantially identical to the first IC package in components and arrangement of the components except in following differences:
the first IC die is located at a third location in the first IC package,
the routing trace in the second IC package is a second routing trace, and
the second routing trace is between the first interconnect at the third location and the second interconnect at the second location.

15. The IC package of claim 7, wherein the dielectric comprises a compound of silicon and at least one of oxygen, carbon, and nitrogen.

16. The IC package of claim 7, wherein the routing layer further comprises at least one of: a transformer, an inductor, a capacitor, a resistor, a diode and a transistor.

* * * * *